US012101947B2

United States Patent
Chen et al.

(10) Patent No.: US 12,101,947 B2
(45) Date of Patent: *Sep. 24, 2024

(54) OLED ANODE STRUCTURES INCLUDING AMORPHOUS TRANSPARENT CONDUCTING OXIDES AND OLED PROCESSING METHOD COMPRISING THE SAME

(71) Applicant: Applied Materials, Inc., Santa Clara, CA (US)

(72) Inventors: Chung-Chia Chen, Hsinchu (TW); Yu-Hsin Lin, Zhubei (TW); Jungmin Lee, Santa Clara, CA (US); Takuji Kato, Yokohama (JP); Dieter Haas, San Jose, CA (US); Si Kyoung Kim, Gwangju-si (KR); Ji Young Choung, Hwaseong-si (KR)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/985,632

(22) Filed: Nov. 11, 2022

(65) Prior Publication Data

US 2023/0389343 A1    Nov. 30, 2023

Related U.S. Application Data

(63) Continuation of application No. 17/828,360, filed on May 31, 2022, now Pat. No. 11,527,732.

(51) Int. Cl.
*H01L 29/08* (2006.01)
*H10K 30/82* (2023.01)
(Continued)

(52) U.S. Cl.
CPC ........... *H10K 30/82* (2023.02); *H10K 50/81* (2023.02); *H10K 71/231* (2023.02);
(Continued)

(58) Field of Classification Search
CPC ...................................... H10K 50/81
(Continued)

(56) References Cited

U.S. PATENT DOCUMENTS

| 6,060,728 A | 5/2000 | Ghosh et al. |
| 6,137,220 A | 10/2000 | Nagayama et al. |

(Continued)

FOREIGN PATENT DOCUMENTS

| CN | 105742311 A | 7/2016 |
| CN | 112103402 A | 12/2020 |

(Continued)

OTHER PUBLICATIONS

Application No. PCT/US2021/021077, International Search Report and Written Opinion, Mailed on Jun. 23, 2021, 7 pages.

(Continued)

*Primary Examiner* — Phuc T Dang
(74) *Attorney, Agent, or Firm* — Kilpatrick Townsend & Stockton LLP

(57) ABSTRACT

Exemplary methods of OLED device processing are described. The methods may include forming an anode on a substrate. Forming the anode may include forming a first metal oxide material on the substrate, forming a metal layer over the first metal oxide material, forming a protective barrier over the metal layer, and forming a second metal oxide material over the amorphous protection material. The protective barrier may be an amorphous protection material overlying the metal layer.

20 Claims, 9 Drawing Sheets

(51) Int. Cl.
*H10K 50/81* (2023.01)
*H10K 71/20* (2023.01)
*H10K 102/00* (2023.01)
*H10K 102/10* (2023.01)

(52) U.S. Cl.
CPC ... *H10K 2102/00* (2023.02); *H10K 2102/102* (2023.02); *H10K 2102/103* (2023.02)

(58) Field of Classification Search
USPC .......................................................... 257/40
See application file for complete search history.

(56) References Cited

U.S. PATENT DOCUMENTS

| | | | |
|---|---|---|---|
| 6,476,988 B1 | 11/2002 | Yudasaka | |
| 8,686,629 B2 | 4/2014 | Oh et al. | |
| 8,987,717 B2 | 3/2015 | Kang | |
| 9,324,962 B2 | 4/2016 | Kim | |
| 9,337,244 B2 | 5/2016 | Hatano et al. | |
| 10,170,526 B1 | 1/2019 | Yang | |
| 10,580,843 B2 | 3/2020 | Zhao et al. | |
| 10,615,231 B2 | 4/2020 | Wu et al. | |
| 11,527,732 B1 * | 12/2022 | Chen | H10K 50/816 |
| 2002/0014836 A1 | 2/2002 | Codama et al. | |
| 2003/0006697 A1 | 1/2003 | Weaver | |
| 2004/0169468 A1 | 9/2004 | Peng | |
| 2006/0170340 A1 | 8/2006 | Tzen et al. | |
| 2009/0009069 A1 | 1/2009 | Takata | |
| 2012/0217516 A1 | 8/2012 | Hatano et al. | |
| 2012/0228603 A1 | 9/2012 | Nakamura | |
| 2013/0001620 A1 | 1/2013 | Sugisawa et al. | |
| 2014/0131743 A1 | 5/2014 | Jiang et al. | |
| 2014/0138639 A1 * | 5/2014 | Kim | H10K 50/818 257/40 |
| 2017/0040565 A1 | 2/2017 | Lee et al. | |
| 2017/0069695 A1 | 3/2017 | Choung et al. | |
| 2018/0011371 A1 | 1/2018 | Noh et al. | |
| 2018/0358584 A1 | 12/2018 | Jeong et al. | |
| 2019/0058020 A1 | 2/2019 | Tsai et al. | |
| 2019/0088730 A1 | 3/2019 | Lee et al. | |
| 2019/0229164 A1 * | 7/2019 | Kim | H10K 50/81 |
| 2019/0348482 A1 | 11/2019 | Bae et al. | |
| 2020/0119114 A1 | 4/2020 | Kim et al. | |
| 2020/0312930 A1 | 10/2020 | Choi et al. | |
| 2021/0135150 A1 | 5/2021 | Wang et al. | |
| 2022/0077251 A1 | 3/2022 | Choung et al. | |
| 2022/0077252 A1 | 3/2022 | Choung et al. | |
| 2022/0077257 A1 | 3/2022 | Choung et al. | |
| 2022/0123250 A1 * | 4/2022 | Kim | H10K 50/16 |

FOREIGN PATENT DOCUMENTS

| | | | | |
|---|---|---|---|---|
| CN | 113745243 A | 12/2021 | | |
| JP | 09330792 A | 12/1997 | | |
| JP | 2009069251 A | 4/2009 | | |
| JP | 2016225319 A | 12/2016 | | |
| KR | 100612118 B1 | 8/2006 | | |
| WO | WO-2006075483 A1 * | 7/2006 | ............. | H01L 27/12 |
| WO | WO-2021261155 A1 * | 12/2021 | ............. | C25D 11/36 |
| WO | 2022039890 A1 | 2/2022 | | |

OTHER PUBLICATIONS

Application No. PCT/US2021/021097, International Search Report and Written Opinion, Mailed on Jul. 1, 2021, 7 pages.

Application No. PCT/US2023/023502, International Search Report and Written Opinion, Mailed On Sep. 8, 2023, 8 pages.

* cited by examiner

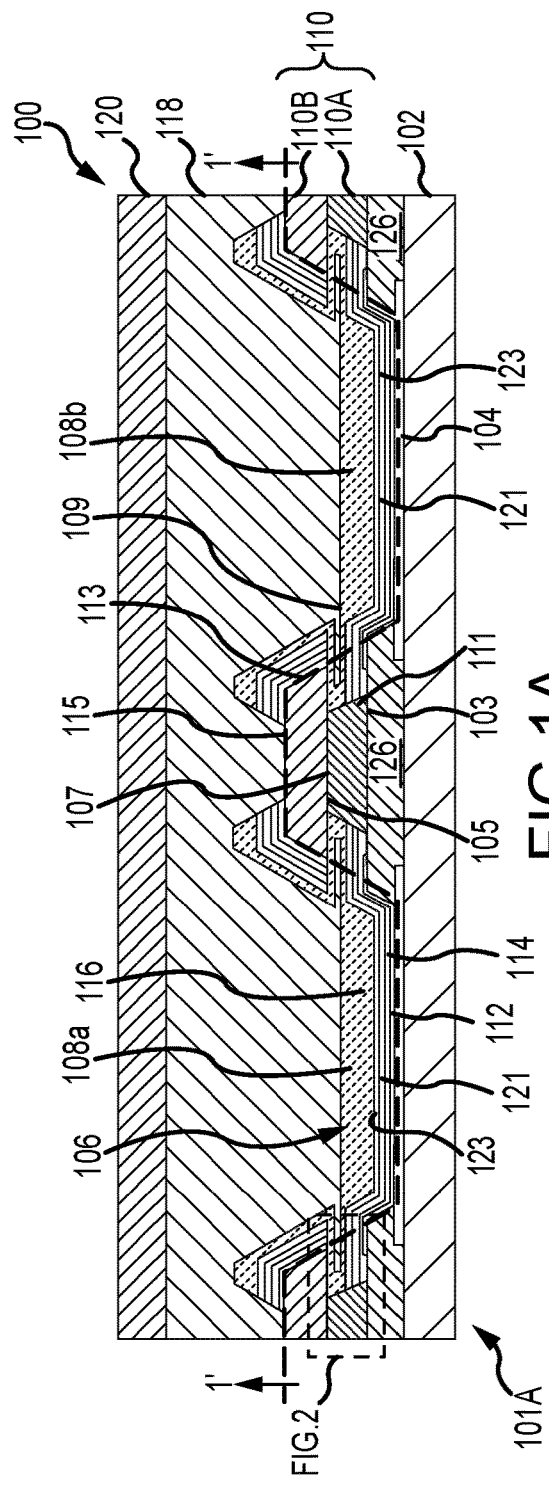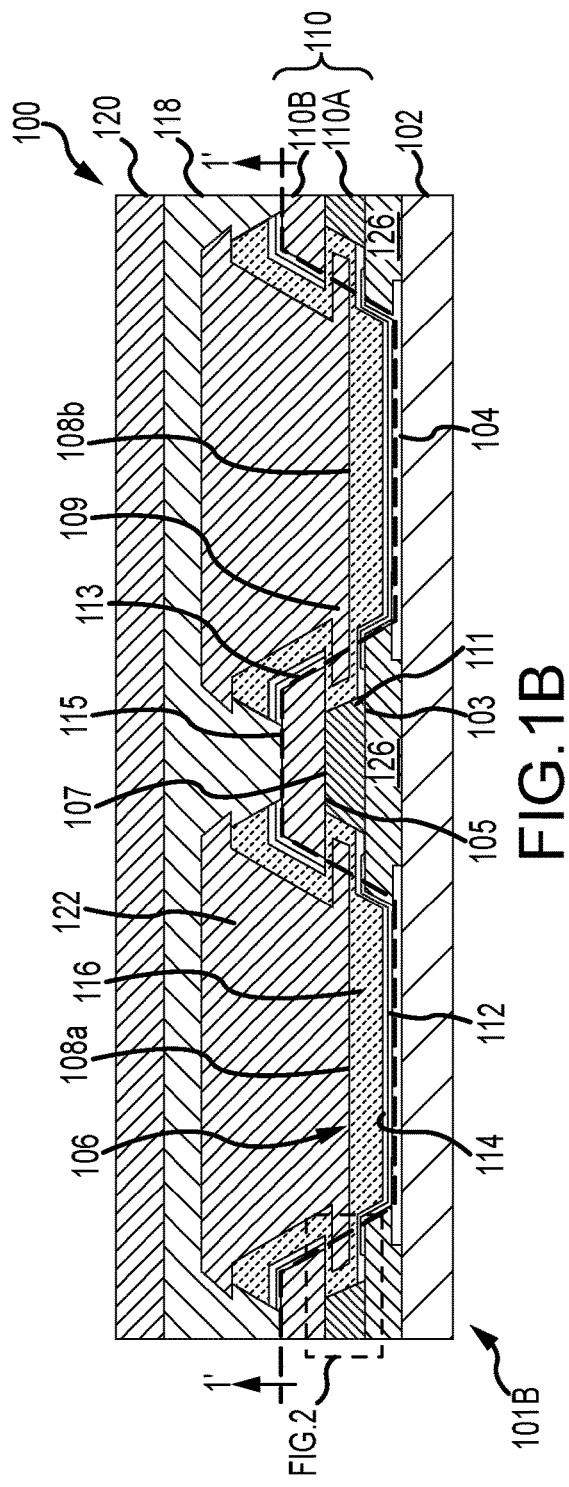

OLED ANODE STRUCTURES INCLUDING AMORPHOUS TRANSPARENT CONDUCTING OXIDES AND OLED PROCESSING METHOD COMPRISING THE SAME

CROSS-REFERENCE TO RELATED APPLICATIONS

This application is a continuation of U.S. application Ser. No. 17/828,360, filed May 31, 2022, now U.S. Pat. No. 11,527,732, granted Dec. 13, 2022, which is hereby incorporated by reference in its entirety for all purposes.

TECHNICAL FIELD

The present technology relates to deposition processes, structures, and systems. More specifically, the present technology relates to methods of producing organic light-emitting diode (OLED) anode structures resistant to etchants.

BACKGROUND

Input devices including display devices may be used in a variety of electronic systems. An organic light-emitting diode (OLED) is a light-emitting diode (LED) in which the emissive electroluminescent layer is a film of an organic compound that emits light in response to an electric current. OLED devices are classified as bottom emission devices if light emitted passes through the transparent or semi-transparent bottom electrode and substrate on which the panel was manufactured. Top emission devices are classified based on whether or not the light emitted from the OLED device exits through the lid that is added following the fabrication of the device. OLEDs are used to create display devices in many electronics. Electronics manufacturers are pushing display devices to shrink in size while providing higher resolution.

OLED pixel patterning may include the deposition and subsequent selective removal of dielectric (e.g., organic materials and inorganic materials) and metal layers. To perform the selective removal operations, dry and/or wet etchants may be contacted with the structures during formation. However, etchants may not be entirely selective to the material desired to be removed and may undesirably interact with underlying layers, ultimately affecting performance of final devices. Thus, there is a need for improved systems and methods that can be used to produce high quality devices and structures. These and other needs are addressed by the present technology.

SUMMARY

Embodiments of the present technology include OLED devices. The devices may include a substrate. The devices may include an anode. The anode may include a first portion of a first metal oxide material overlying the substrate. The anode may include a metal material overlying the first portion of the first metal oxide material. The metal material may be or include silver. The anode may include a protective barrier overlying (i.e., above) the metal material. The protective barrier may include an amorphous protection material. The anode may include a second portion of the first metal oxide material overlying the protective barrier. The devices may include an OLED material electrically connected to the anode. The devices may include a cathode electrically connected to the OLED material.

In some embodiments, the second portion of the first metal oxide material may overly the amorphous protection material. The protective barrier may include a second metal oxide material between the metal material and the amorphous protection material. The second metal oxide material may be the same metal oxide as the first metal oxide material. At least a portion of the second metal oxide material may be crystallized.

Some embodiments of the present technology encompass OLED device processing methods. The methods may include forming an anode on a substrate. Forming the anode may include forming a first metal oxide material on a substrate and forming a metal layer over the first metal oxide material. The metal layer may be or include silver. Forming the anode may include forming an amorphous protection material over the metal layer. The amorphous protection material may include a second metal oxide. Forming the anode may include forming a second metal oxide material over the amorphous protection material. The second metal oxide material may include a crystalline material having one or more grain boundaries. The grain boundaries may include one or more voids. The methods may include forming an OLED material. The OLED material may be electrically connected to the anode. The methods may include forming a cathode. The cathode may be electrically connected to the OLED material.

In some embodiments, the first metal oxide material, the second metal oxide material, or both may be or include indium tin oxide (ITO). The first metal oxide material and the second metal oxide material may be or include the same material. The amorphous protection material may be or include indium zinc oxide (IZO), indium tin zinc oxide (ITZO), indium gallium zinc oxide (IGZO). A thickness of the amorphous protection material may be less than or about 50 nm. The amorphous protection material may be characterized by a volumetric crystallinity of less than or about 10 vol. %. The amorphous protection material may be deposited via physical vapor deposition. The methods may include, subsequent to forming the second metal oxide material, exposing the substrate to an etchant. The amorphous protection material reduces an amount of etchant interacting with the metal layer. The methods may include, subsequent to forming the metal layer, forming a third metal oxide material over the metal layer. The third metal oxide material may be or include the same material as the first metal oxide material, the second metal oxide material, or both. A combined thickness of the amorphous protection material, the second metal oxide material, the third metal oxide material may be less than or about 100 nm. The third metal oxide material may overly the metal layer. The third metal oxide material may include at least a portion of crystallized material.

Some embodiments of the present technology encompass OLED device processing methods. The methods may include forming an anode on a substrate. Forming the anode may include forming a first metal oxide material on a substrate and forming a metal layer over the first metal oxide material. The metal layer may be or include silver. Forming the anode may include forming a protective barrier over the metal layer. The protective barrier may include an amorphous protection material over the metal layer and a second metal oxide material over the amorphous protection material. Forming the anode may include forming a second metal oxide material over the amorphous protection material. The methods may include forming an OLED material. The OLED material may be electrically connected to the anode.

The methods may include forming a cathode. The cathode may be electrically connected to the OLED material.

In some embodiments, the protective barrier may include a third metal oxide material between the metal layer and the amorphous protection material. The third metal oxide material may be a crystalline material. The protective barrier may be characterized by a thickness of less than or about 100 nm.

The present technology provides numerous benefits over conventional technologies. Embodiments of the present technology form protection barriers that can withstand etchants during subsequent operations. In embodiments, the protection barriers may include amorphous materials that may reduce or prevent etchants, both dry and wet etchants, from reaching underlying materials, such as metal layers. Additionally, the protection barriers may permit thicknesses of other layers to be relaxed, which may increase device performance by reducing absorption of light. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 1A shows a schematic, cross-sectional view of a sub-pixel circuit having a plugless arrangement according to embodiments of the present technology.

FIG. 1B shows a schematic, cross-sectional view of a sub-pixel circuit having a plug arrangement according to embodiments of the present technology.

Figure 1C:
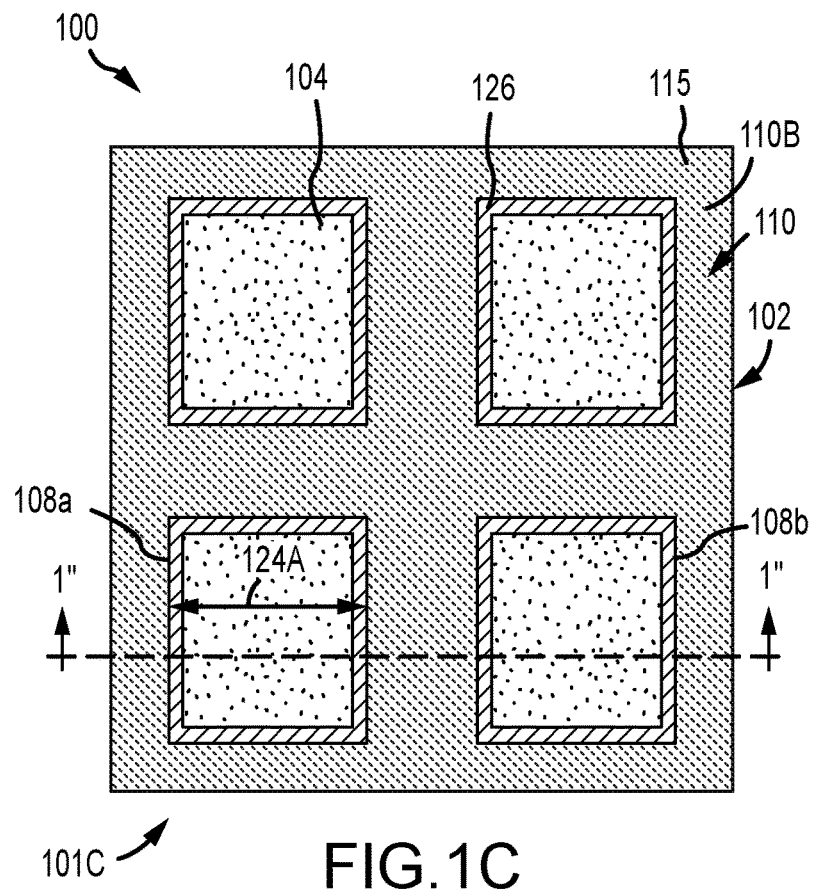
FIG. 1C shows a schematic, top sectional view of a sub-pixel circuit having a dot-type architecture according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Backplane processing includes operations that produce intricately patterned material on a substrate. The operations include remote and in-situ formation and removal processes that utilize corrosive materials, including acidic materials and ionized plasmas of oxygen-containing, sulfur-containing, and halogen-containing compounds, radicals, and ions. For example, etching operations often involve contacting a substrate with a liquid, gas, or plasma etchant that flows into a processing region of a processing apparatus. While the etchants are intended to etch specific materials, the etchants may also react with materials that are intended not to be etched. Furthermore, portions of etchants may travel through layers to underlying layers via voids in the overlying layers. When the etchants travel to underlying layers, the underlying material may be etched or bulged.

OLED formation methods have struggled to limit etching to specific layers in anode structures, such as in OLEDs. During OLED formation, dielectric and/or metal layers overlying the anode structure may be deposited and portions may subsequently be removed. During removal, etchants may be provided to remove portions of the layers. For example, dry etch processes may be performed to remove dielectric material and wet etch processes may be used to remove metal material. A metal oxide material overlying metal material in the anode structure may allow etchants to reach and interact with the metal layer. The etchants may cause the metal layer to bulge or even remove portions of the metal layer. To counter etchants from interacting with the metal layer, some OLED formation methods have deposited thicker metal oxide materials over the metal layer to be protected. However, the thicker metal oxide materials still allow etchants to pass through voids in the material, which then interact with the metal layer. Furthermore, thicker metal oxide materials in final devices absorb more light and reduce efficiency of the OLED.

Embodiments of the present technology addresses these and other issues by forming a protection barrier between the metal layer and the metal oxide material in the anode structure. The protection barrier may include an amorphous protection material. The amorphous protection material may be a transparent material that is resistant to crystallizing during subsequent operations. The amorphous protection material may lack grain boundaries and therefore voids in the material. Accordingly, the amorphous protection material may reduce or prevent etchants from reaching the metal layer. By reducing or preventing etchants from reaching the metal layer, the metal layer may maintain its structure. Furthermore, the thickness of the metal oxide layer overlying the protection barrier may be reduced compared to some OLED formation technologies, which may result in better performance of the final device.

The remaining disclosure identifies specific materials, components, and backplane processing methods according to embodiments of the present technology. It is readily understood that the described methods, materials, components, and systems can apply to a variety of other methods, materials, components, and systems used for backplane device fabrication, and the fabrication of other kinds of devices where protection barriers protect underlying materials in the structure. Accordingly, the present technology is not limited to the described methods, materials, components, and systems. The disclosure will discuss non-limiting operations of exemplary methods as well as general structures that may be protected according to embodiments of the present technology.

FIG. 1A is a schematic, cross-sectional view of a sub-pixel circuit 100 having a plugless arrangement 101A. FIG. 1B is a schematic, cross-sectional view of a sub-pixel circuit 100 having a plug arrangement 101B. Each of the cross-sectional views of FIGS. 1A-1B are taken along section line 1"-1" of FIGS. 1C-1D.

The sub-pixel circuit 100 may include a substrate 102. Metal-containing layers 104, which may include one or more layers, such as a stack of layers, may be patterned on the substrate 102 and may be defined by adjacent pixel-defining layer (PDL) structures 126 disposed on the substrate 102. In embodiments, the metal-containing layers 104 may be pre-patterned on the substrate 102. For example, the substrate 102 may be a pre-patterned indium tin oxide (ITO) glass substrate. The metal-containing layers 104 may be configured to operate anodes of respective sub-pixels. The metal-containing layers 104 may include, but are not limited to, chromium, titanium, gold, silver, copper, aluminum, ITO, a combination thereof, or other suitably conductive materials.

The PDL structures 126 may be disposed on the substrate 102. The PDL structures 126 may include one of an organic material, an organic material with an inorganic coating disposed thereover, or an inorganic material. The organic material of the PDL structures 126 may include, but is not limited to, polyimides. The inorganic material of the PDL structures 126 may include, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent PDL structures 126 may define a respective sub-pixel and expose the anode (i.e., metal-containing layers 104) of the respective sub-pixel of the sub-pixel circuit 100.

The sub-pixel circuit 100 may have a plurality of sub-pixels 106 including at least a first sub-pixel 108a and a second sub-pixel 108b. While the Figures depict the first sub-pixel 108a and the second sub-pixel 108b, the sub-pixel circuit 100 of the embodiments described herein may include two or more sub-pixels 106, such as a third and a fourth sub-pixel. Each sub-pixel 106 may include an OLED material 112 configured to emit a white, red, green, blue or other color light when energized. For example, the OLED material 112 of the first sub-pixel 108a may emit a red light when energized, the OLED material of the second sub-pixel 108b may emit a green light when energized, the OLED material of a third sub-pixel may emit a blue light when energized, and the OLED material of a fourth sub-pixel may emit another color light when energized.

Overhang structures 110 may be disposed on an upper surface 103 of each of the PDL structures 126. The overhang structures 110 may be permanent to the sub-pixel circuit. The overhang structures 110 may further define each sub-pixel 106 of the sub-pixel circuit 100. The overhang structures 110 include at least an upper portion 110B disposed on a lower portion 110A. A first configuration of the overhang structures 110 may include the upper portion 110B of a non-conductive inorganic material and lower portion 110A of a conductive inorganic material. A second configuration of the overhang structures 110 may include the upper portion 110B of a conductive inorganic material and the lower portion 110A of a conductive inorganic material. A third configuration of the overhang structures 110 may include the upper portion 110B of a non-conductive inorganic material, the lower portion 110A of a non-conductive inorganic material, and an assistant cathode 202 (shown in FIG. 2) disposed under the lower portion 110A. While shown as separate from the lower portion 110A, the assistant cathode 202 may be a base of the overhang structures 110. A fourth configuration of the overhang structures 110 may include the upper portion 110B of a conductive inorganic material, the lower portion 110A of a non-conductive inorganic material, and an assistant cathode 202 disposed under the lower portion 110A. In embodiments, the lower portion 110A may be multiple layers, with the lowest layer of the lower portion 110A being a conductive or non-conductive material and another layer, such as an upper layer or intermediate layer of the lower portion 110A, also being a conductive or non-conductive material. In some embodiments, in addition or in alternative to the assistant cathode 202, the overhang structures 110 may include an overhang base (not shown). The overhang base may be characterized by a thickness greater than a thickness of the assistant cathode 202. The overhang base may or may not be in contact with the cathode 114. Furthermore, the overhang base may be conductive or non-conductive. In embodiments, the assistant cathode 202 may be incorporated into the overhang base. Additionally or alternatively, the overhang base or other portions of the overhang structures 110 may serve as the assistant cathode 202. The first, second, third, and fourth exemplary embodiments of the sub-pixel circuit 100 may include overhang structures 110 of at least one of the first, second, third, or fourth configurations. The overhang structures 110 may be able to remain in place (i.e., the overhang structures 110 may be permanent). Thus, organic material from lifted off overhang structures that disrupt OLED performance may not be left behind. Eliminating the need for a lift-off procedure may also increase throughput.

The non-conductive inorganic material may include, but it not limited to, an inorganic silicon-containing material. The silicon-containing material may include oxides or nitrides of silicon, or combinations thereof. The conductive inorganic material may include, but it not limited to, a metal-containing material. The metal-containing material may include copper, titanium, aluminum, molybdenum, silver, indium tin oxide, indium zinc oxide, or combinations thereof.

A bottom surface 107 of the upper portion 110B may be wider than a top surface 105 of the lower portion 110A to form an overhang 109. The bottom surface 107 larger than the top surface 105 forming the overhang 109 may allow for the upper portion 110B to shadow the lower portion 110A. The shadowing of the overhang 109 may provide for evaporation deposition each of the OLED material 112 and a cathode 114.

The OLED material 112 may include one or more of a HIL, a HTL, an EML, and an ETL. The OLED material 112 may be disposed on the metal-containing layers 104. In embodiments, the OLED material 112 may be disposed on the metal-containing layers 104 and over a portion of the PDL structures 126. The cathode 114 may be disposed over the OLED material 112 and over or on the PDL structures 126 in each sub-pixel 106. The cathode 114 may be electrically connected to the OLED material 112 The cathode 114 may be disposed on a portion of a sidewall 111 of the lower portion 110A. It is also contemplated that the OLED material 112 may additionally or alternatively be disposed on a portion of the sidewall 111 of the lower portion. The cathode 114 and the assistant cathode 202 may include a conductive material, such as a metal. The cathode 114 and/or the assistant cathode 202 may include, but are not limited to, chromium, titanium, aluminum, ITO, or a combination thereof. In embodiments, the OLED material 112 and the cathode 114 may be disposed over a sidewall 113 of the upper portion 110B of the overhang structures 110. In embodiments, the OLED material 112 and the cathode 114 may be disposed over a top surface 115 of the upper portion 110B of the overhang structures 110.

Each sub-pixel 106 may include an encapsulation layer 116. The encapsulation layer 116 may be or may correspond to a local passivation layer. The encapsulation layer 116 of a respective sub-pixel may be disposed over the cathode 114 (and OLED material 112) with the encapsulation layer 116 extending under at least a portion of each of the overhang structures 110 and along a sidewall of each of the overhang structures 110. The encapsulation layer 116 may be disposed over the cathode 114 and over at least the sidewall 111 of the lower portion 110A. In embodiments, the encapsulation layer 116 may be disposed over the sidewall 113 of the upper portion 110B. In embodiments, the encapsulation layer 116 may be disposed over the top surface 115 of the upper portion 110B of the overhang structures 110. The encapsulation layer 116 may include an inorganic material, such as a silicon-containing material. The silicon-containing material may include $Si_3N_4$ containing materials.

In embodiments including one or more capping layers, the capping layers may be disposed between the cathode 114 and the encapsulation layer 116. As shown in FIG. 1A, a first capping layer 121 and a second capping layer 123 may be disposed between the cathode 114 and the encapsulation layer 116. While FIG. 1A depicts the sub-pixel circuit 100 having one or more capping layers, each of the embodiments described herein may include one or more capping layers disposed between the cathode 114 and the encapsulation layer 116. The first capping layer 121 may include an organic material. The second capping layer 123 may include an inorganic material, such as lithium fluoride. The first capping layer 121 and the second capping layer 123 may be deposited by evaporation deposition.

The plugless arrangement 101A and the plug arrangement 101B of the sub-pixel circuit 100 may include at least a global passivation layer 120 disposed over the overhang structures 110 and the encapsulation layers 116. An inkjet layer 118 may be disposed between the global passivation layer 120 and the overhang structures 110 and the encapsulation layers 116. The inkjet layer 118 may include an acrylic material. The plug arrangement 101B may include an intermediate passivation layer disposed over the overhang structures 110 and plugs 122 of each of the sub-pixels 106, and disposed between the plugs 122 of each of the sub-pixels 106 and the inkjet layer 118.

The plug arrangement 101B may include plugs 122 disposed over the encapsulation layers 116. Each plug 122 may be disposed in a respective sub-pixel 106 of the sub-pixel circuit 100. The plugs 122 may be disposed over the top surface 115 of the upper portion 110B of the overhang structures 110. In embodiments, the plugs 122 may have an additional passivation layer disposed thereon. The plugs 122 may include, but are not limited to, a photoresist, a color filter, or a photosensitive monomer. The plugs 122 may have a plug transmittance that is matched or substantially matched to an OLED transmittance (e.g., OLED emission wavelength) of the OLED material 112. The plugs 122 may each be the same material and match the OLED transmittance. The plugs 122 may be different materials that match the OLED transmittance of each respective sub-pixel of the plurality of sub-pixels 106. The matched or substantially matched resist transmittance and OLED transmittance allow for the plugs 122 to remain over the sub-pixels 106 without blocking the emitted light from the OLED material 112. The plugs 122 may be able to remain in place and thus may not require a lift off procedure to be removed from the sub-pixel circuit 100. Additional pattern resist materials over the formed sub-pixels 106 at subsequent operations may not be required because the plugs 122 remain. Eliminating the need for a lift-off procedure on the plugs 122 and the need for additional pattern resist materials on the sub-pixel circuit 100 may increase throughput.

Figure 1D:
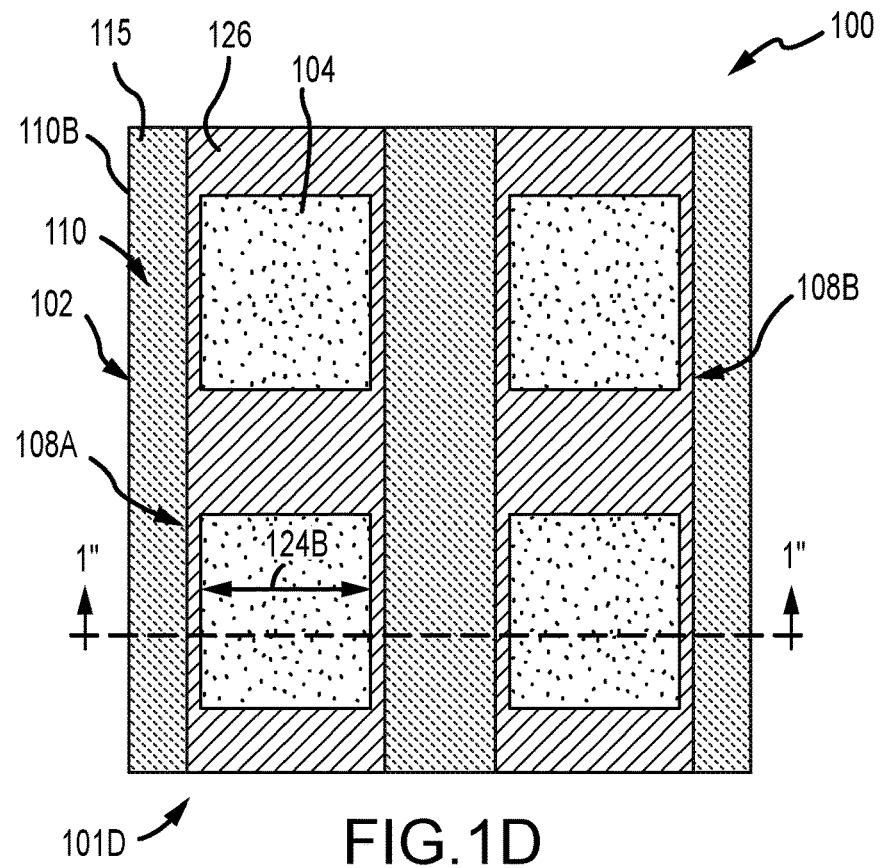
FIG. 1D is a schematic, cross-sectional view of a sub-pixel circuit having a line-type architecture according to embodiments of the present technology.

FIG. 1C is a schematic, top sectional view of a sub-pixel circuit 100 having a dot-type architecture 101C. FIG. 1D is a schematic, cross-sectional view of a sub-pixel circuit 100 having a line-type architecture 101D. Each of the top sectional views of FIGS. 1C-1D are taken along section line 1'-1' of FIGS. 1A-1B.

The dot-type architecture 101C may include a plurality of pixel openings 124A. Each of pixel opening 124A may be surrounded by overhang structures 110 that define each of the sub-pixels 106 of the dot-type architecture 101C. The line-type architecture 101D may include a plurality of pixel openings 124B. Each of pixel opening 124B may be abutted by overhang structures 110 that define each of the sub-pixels 106 of the line-type architecture 101D.

Figure 2:
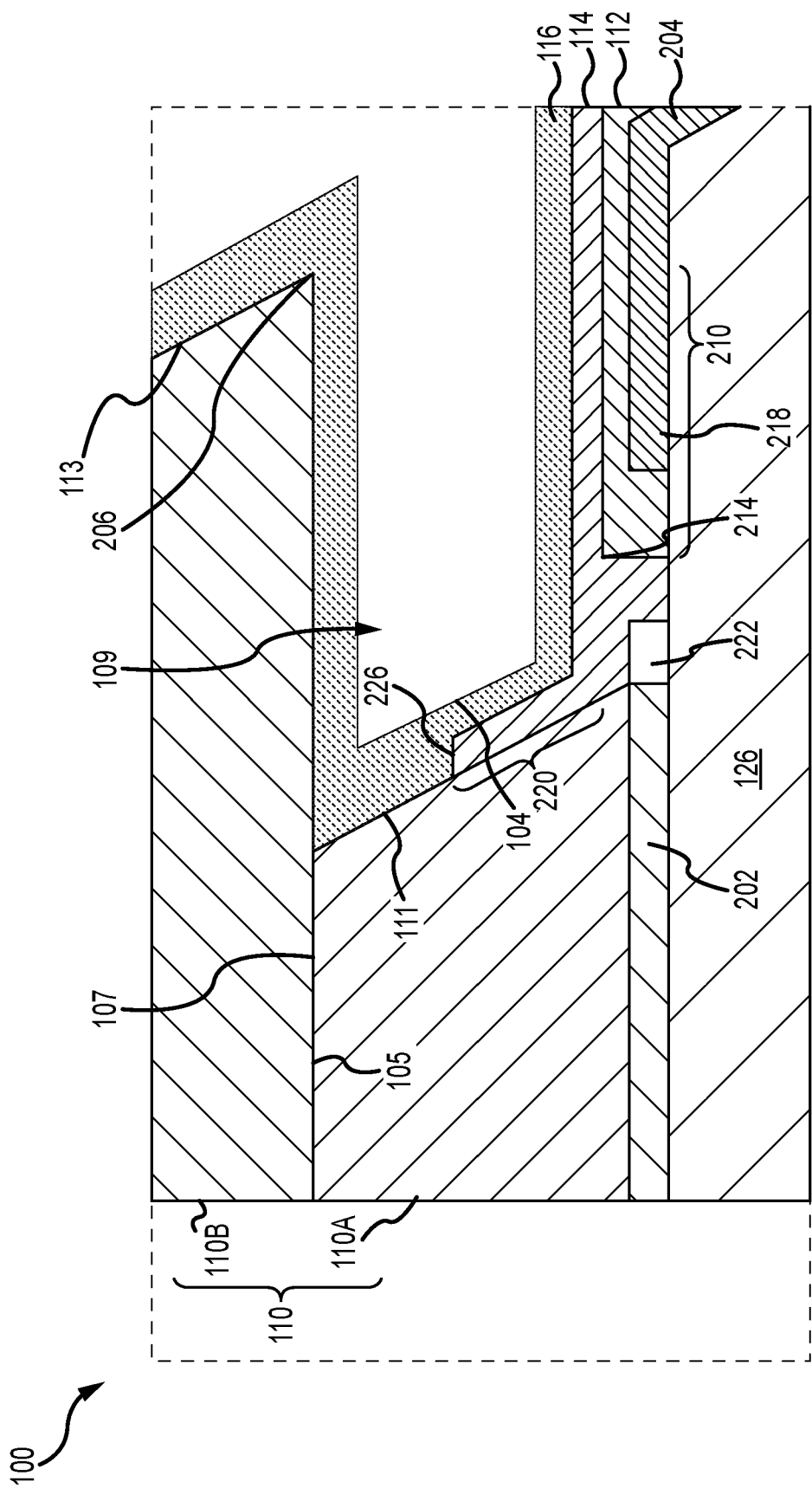
FIG. 2 is a schematic, cross-sectional view of an overhang structure of a sub-pixel circuit according to embodiments of the present technology.

FIG. 2 is a schematic, cross-sectional view of an overhang structure 110 of a sub-pixel circuit 100. While FIG. 2 depicts the third and fourth configurations of the overhang structures 110, the description herein is applicable to the first configuration of the overhang structures 110 including the upper portion 110B of a non-conductive inorganic material and the lower portion 110A of a conductive inorganic material, and the second configuration of the overhang structures 110 including the upper portion 110B of a conductive inorganic material and the lower portion 110A of a conductive inorganic material. In the first and second configurations, and as illustrated in FIG. 2, the OLED material 112 may not contact the lower portion 110A of the overhang structures 110, and the cathode 114 may contact the lower portion 110A of the overhang structures 110. In the third and fourth configurations, the OLED material 112 may not contact the lower portion 110A and the assistant cathode 202, and the cathode 114 may contact at least the assistant cathode 202.

The upper portion 110B may include an underside edge 206. The OLED material 112 may be disposed over the anode and over a shadow portion 210 of the PDL structure 126. The OLED material 112 maybe electrically connected to the anode (i.e., the metal-containing layers 104). In embodiments, a HIL 204 of the OLED material 112 may be included. In embodiments including the HIL 204, the OLED material 112 may include the HTL, the EML, and the ETL. In embodiments including the HIL 204, the HIL 204 may not contact the lower portion 110A of the overhang structures 110. In embodiments including the HIL 204, one or more additional portions of the OLED material 112 (e.g., the HTL, the EML, and the ETL) may or may not contact the lower portion 110A of the overhang structures 110.

The cathode 114 may be disposed over the OLED material 112 and over the shadow portion 210 of the PDL structure 126. In embodiments, the cathode 114 may be disposed on a portion 220 of the sidewall 111 of the lower portion 110A. In embodiments, the cathode 114 may contact a portion 222 of the assistant cathode 202 on the shadow portion 210 of the PDL 126. In embodiments with the cathode 114 contacting the portion 222 of the assistant cathode 202, the cathode 114 may also contact the portion 220 of the sidewall 111 of the lower portion 110A. The encapsulation layer 116 may be disposed over the cathode 114 (and OLED material 112) with the encapsulation layer 116 extending at least under the upper portion 110B of the overhang structure 110 and along the sidewall 111 of the lower portion 110A.

During evaporation deposition of the OLED material 112, the underside edge 206 of the upper portion 110B may define the position of the OLED edge 214. The OLED material 112 may be evaporated at an OLED maximum angle that ensures that the OLED material 112 is not deposited past the OLED edge 214. In embodiments with the HIL 204, the underside edge 206 of the upper portion 110B may define the position of the HIL edge 218. The HIL 204 may be evaporated at an HIL maximum angle that ensures that HIL 204 is not deposited past the HIL edge 218. During evaporation deposition of the cathode 114, the underside edge 206 of the upper portion 110B defines the position of the cathode edge 226. The cathode 114 may be evaporated at a cathode maximum angle that ensures that the cathode 114 is not deposited past the cathode edge 226.

Figure 3:
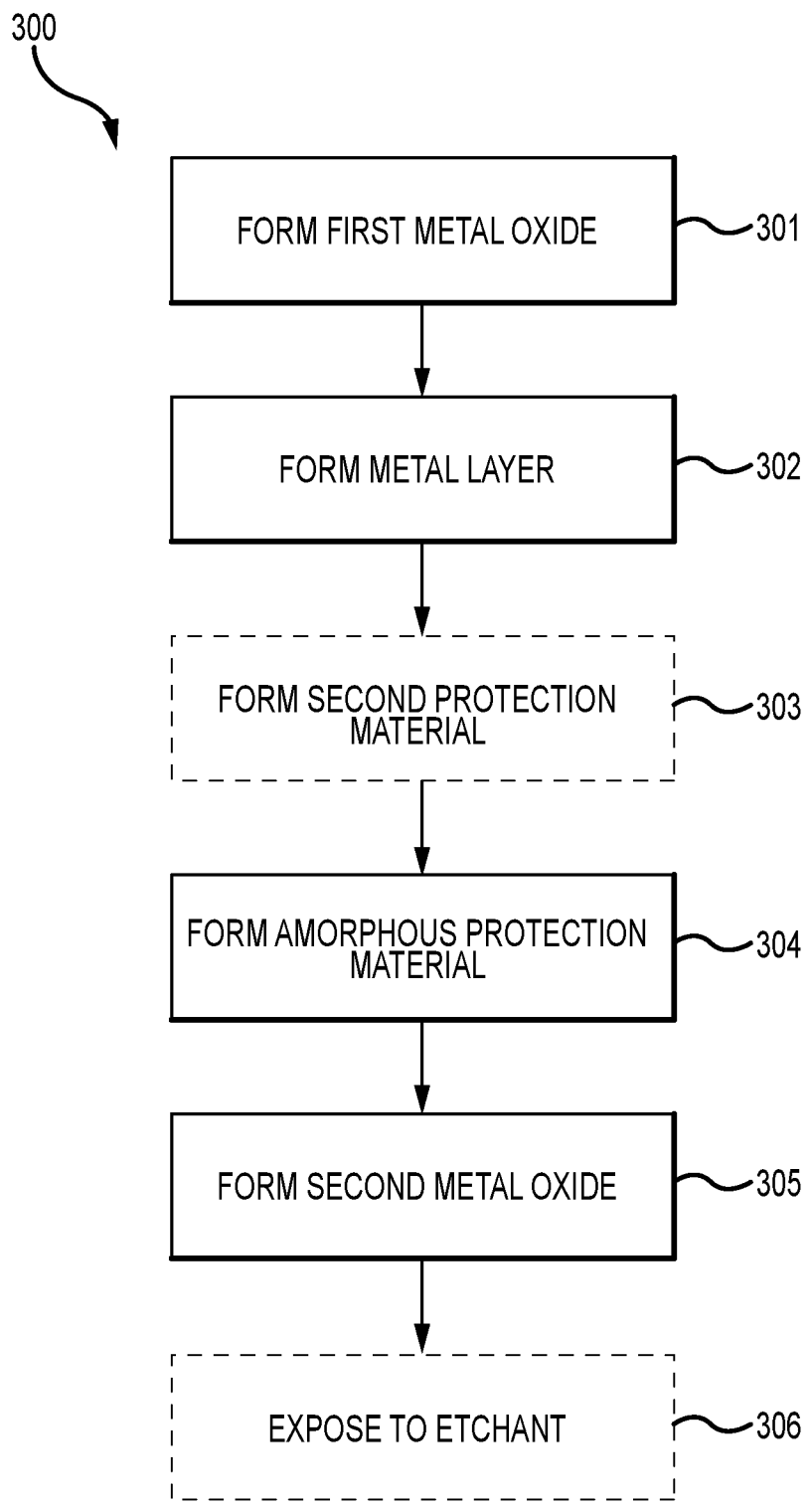
FIG. 3 shows operations of an exemplary method of processing according to embodiments of the present technology.
Figure 4A:
FIGS. 4A-4C show schematic cross-sectional views of a sub-pixel circuit of according to embodiments of the present technology.
Figure 4B:
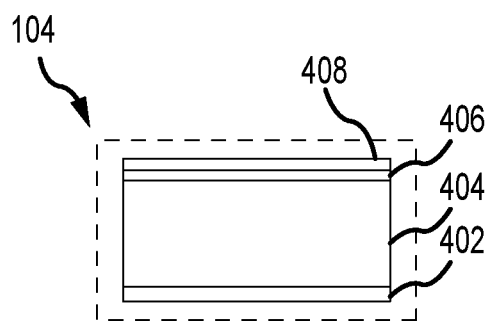
Figure 4C:
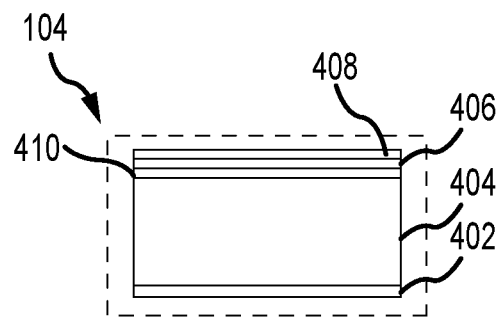

FIG. 3 is a flow diagram of a method 300 of backplane processing. The method 300 may correspond to a method to fabricate an anode of a sub-pixel circuit 100. FIGS. 4A-4C are schematic, cross-sectional views of a substrate 102 during the method 300 for forming the anode (i.e., metal-containing layers 104) of a sub-pixel circuit 100 according to embodiments described herein. Method 300 may form a protection barrier to prevent etchants from interacting with a metal layer on which the protection barrier may be formed. The protection barrier may include a single metal oxide layer or multiple layers that form a multi-layer stack protection barrier.

At operation 301, as shown in FIGS. 4A-4C, a first metal oxide material 402 may be formed on the substrate 102. In embodiments, the first metal oxide material 402 may be or include ITO. The first metal oxide material 402 may be characterized by a thickness of less than or about 50 nm, such as less than or about 45 nm, less than or about 40 nm, less than or about 35 nm, less than or about 30 nm, less than or about 25 nm, less than or about 20 nm, less than or about 18 nm, less than or about 16 nm, less than or about 14 nm, less than or about 12 nm, less than or about 10 nm, less than or about 9 nm, less than or about 8 nm, less than or about 7 nm, or less.

At operation 302, as shown in FIGS. 4A-4C, a metal layer 404 may be formed on the first metal oxide material 402. The metal layer 404 may be or include silver, among other metals. The metal layer 404 may be characterized by a thickness of less than or about 150 nm, such as less than or about 140 nm, less than or about 130 nm, less than or about 120 nm, less than or about 115 nm, less than or about 110 nm, less than or about 105 nm, less than or about 100 nm, or less. Similarly, the metal layer 404 may be characterized by a thickness of greater than or about 60 nm, greater than or about 70 nm, greater than or about 80 nm, greater than or about 90 nm, greater than or about 95 nm, greater than or about 100 nm, or more.

At operation 304, as shown in FIGS. 4A-4C, an amorphous protection material 406 of a protective barrier may be formed on the metal layer 404. The amorphous protection material 406 may be or include a metal oxide. The metal oxide of the amorphous protection material 406 may include any transparent conductive oxide (TCO) that maintains an amorphous structure during subsequent processing, such as at elevated temperatures (e.g., greater than or about 300° C.). For example, the metal oxide may be or include, but is not limited to, indium zinc oxide (IZO), indium tin zinc oxide (ITZO), indium gallium zinc oxide (IGZO). The amorphous protection material 406 may be characterized by a thickness of less than or about 50 nm, such as less than or about 45 nm, less than or about 40 nm, less than or about 35 nm, less than or about 30 nm, less than or about 25 nm, less than or about 20 nm, less than or about 15 nm, less than or about 10 nm, less than or about 9 nm, less than or about 8 nm, less than or about 7 nm, less than or about 6 nm, less than or about 5 nm, or less. Furthermore, a volumetric crystallinity of the metal oxide material in the amorphous protection material 406 may be less than or about 10 vol. %, less than or about 9 vol. %, less than or about 8 vol. %, less than or about 7 vol. %, less than or about 6 vol. %, less than or about 5 vol. %, less than or about 4 vol. %, less than or about 3 vol. %, less than or about 2 vol. %, less than or about 1 vol. %, or less based on the total volume of the amorphous protection material 406. At volumetric crystallinities of less than or about 10 vol. %, the amorphous protection material 406 may include few or no grain boundaries, and therefore voids, in the material.

The amorphous protection material 406 may include any TCO that maintains an amorphous structure during subsequent processing. Due to the transparency of the amorphous protection material 406, high optical transparency of final devices may be maintained. Furthermore, as discussed below, the amorphous protection material 406 may afford a thinner second metal oxide material 408 to be used, which may further increase optical transparency of final devices. Additionally, the amorphous protection material 406 may have a low porosity due to the low levels of crystallinity. The low porosity may serve to protect the underlying metal layer 404 during subsequent processing, as further discussed below.

At operation 305, as shown in FIGS. 4A-4C, a second metal oxide material 408 may be formed on the amorphous protection material 406. The second metal oxide material 408 may be a crystalline material having one or more grain boundaries. The grain boundaries of the second metal oxide material 408 may include one or more voids. The one or more voids in the second metal oxide material 408 may provide access or a path to the underlying material (e.g., the amorphous protection material 406). In embodiments, the second metal oxide material 408 may be or include the same or a different material as the first metal oxide material 402. That is, the second metal oxide material 408 may be or include ITO. The second metal oxide material 408 may be characterized by a thickness of less than or about 50 nm, such as less than or about 45 nm, less than or about 40 nm, less than or about 35 nm, less than or about 30 nm, less than or about 25 nm, less than or about 20 nm, less than or about 15 nm, less than or about 10 nm, less than or about 9 nm, less than or about 8 nm, less than or about 7 nm, less than or about 6 nm, less than or about 5 nm, less than or about 4 nm, or less. Furthermore, a volumetric crystallinity of the metal oxide material in the second metal oxide material 408 may be greater than or about 50 vol. %, less than or about 60 vol. %, less than or about 70 vol. %, less than or about 80 vol. %, less than or about 90 vol. %, less than or about 95 vol. %, or more based on the total volume of the second metal oxide material 408.

At optional operation 303, as shown in FIGS. 4A-4C, a third metal oxide material 410 may be formed on the metal layer 404. The third metal oxide material 410 may be formed prior to forming the amorphous protection material 406. The third metal oxide material 410 may increase adhesion between the metal layer 404 and the amorphous protection material 406. Alternatively or additionally, the third metal oxide material 410 may be formed to protect the metal layer 404 in embodiments where the structure may be exposed to atmosphere, such as during transfer between chambers, prior to forming the amorphous protection material 406. In embodiments, the third metal oxide material 410 may include the same material as the first metal oxide material 402, the second metal oxide material 408, or both. That is, the metal oxide of the third metal oxide material 410 may include, but is not limited to, ITO, ITZO, or, IGZO. In additional embodiments, the third metal oxide material 410 may include the same material as the amorphous protection material 406. That is, the metal oxide of the third metal oxide material 410 may include, but is not limited to IZO, ITZO, or, IGZO.

The third metal oxide material 410 may be characterized by a thickness of less than or about 50 nm, such as less than or about 45 nm, less than or about 40 nm, less than or about 35 nm, less than or about 30 nm, less than or about 25 nm, less than or about 20 nm, less than or about 15 nm, less than or about 10 nm, less than or about 9 nm, less than or about 8 nm, less than or about 7 nm, less than or about 6 nm, less than or about 5 nm, less than or about 4 nm, or less. In embodiments, the metal oxide in the third metal oxide material 410 may be a crystalline material. It is also contemplated that the metal oxide in the third metal oxide material 410 may be an amorphous material. Accordingly, a volumetric crystallinity of the third metal oxide material 410 may be greater than or about 50 vol. %, less than or about 60 vol. %, less than or about 70 vol. %, less than or about 80 vol. %, less than or about 90 vol. %, less than or about 95 vol. %, or more based on the total volume of the third metal oxide material 410. Similarly, a volumetric crystallinity of the third metal oxide material 410 may be less than or about 10 vol. %, less than or about 9 vol. %, less than or about 8 vol. %, less than or about 7 vol. %, less than or about 6 vol. %, less than or about 5 vol. %, less than or about 4 vol. %, less than or about 3 vol. %, less than or about 2 vol. %, less than or about 1 vol. %, or less based on the total volume of the third metal oxide material 410.

The protective barrier, which may include the amorphous protection material 406, the second metal oxide material 408, and/or the third metal oxide material 410, may be characterized by a thickness of less than or about 100 nm. At greater thicknesses, efficiency in final devices may be decreased due to increased absorption of light in the protective barrier. Accordingly, the protective barrier may be characterized by a thickness of less than or about 95 nm, less than or about 90 nm, less than or about 85 nm, less than or about 80 nm, less than or about 75 nm, less than or about 70 nm, less than or about 65 nm, less than or about 60 nm, less than or about 55 nm, less than or about 45 nm, less than or about 40 nm, less than or about 35 nm, less than or about 30 nm, less than or about 25 nm, less than or about 20 nm, less than or about 18 nm, less than or about 16 nm, less than or about 15 nm, less than or about 14 nm, less than or about 13 nm, less than or about 12 nm, less than or about 11 nm, less than or about 10 nm, less than or about 9 nm, or less. In embodiments, the method 300 may include forming an OLED material, such as OLED material 112. Additionally, in some embodiments, the method 300 may include forming a cathode, such as cathode 114.

At operation 306, and as further discussed below (e.g., operations 504 and/or 507), the substrate 102 may be exposed to an etchant. Additional materials may be formed on the substrate between operations 305 and 306, and operation 306 may not necessarily follow operation 305 immediately. As additional materials are formed and removed from the substrate, etchants may be used to remove material. Without the amorphous protection material 406, gaseous species in a dry etch may travel through voids in the second metal oxide material 408. The plasma may react with the metal layer 404, such as the silver, to form silver oxide, silver fluoride, silver chloride, and/or silver sulfide. The resultant compounds may create bulges or inconsistencies on a surface/inside of the metal layer 404. The bulges or inconsistencies may not reflect light and may decrease performance of the structure or final device. Similarly, without the amorphous protection material 406, liquid species may travel through voids in the second metal oxide material 408. The acidic material may remove material in the metal layer 404 underlying the second metal oxide material 408, such as through pit etching. The removal of material may result in the metal layer 404 not reflecting light and may decrease performance of the structure or final device.

The amorphous protection material 406 overlying the metal layer 404 may be characterized by a low etch rate (e.g., high etch resistance). Accordingly, the amorphous protection material 406 may maintain a smoothness and/or roughness of the metal layer 404 during etching operations subsequent formation method 500. By maintaining a smooth surface of the metal layer 404, light reflection during operation may be maintained and light may be properly reflected by the metal layer 404. If etchants were able to freely remove or penetrate the amorphous protection material 406, the defects in the metal layer 404 may either scatter the light being reflected by the metal layer 404 or allow the light to pass through without reflection, thereby reducing final device performance.

Figure 5:
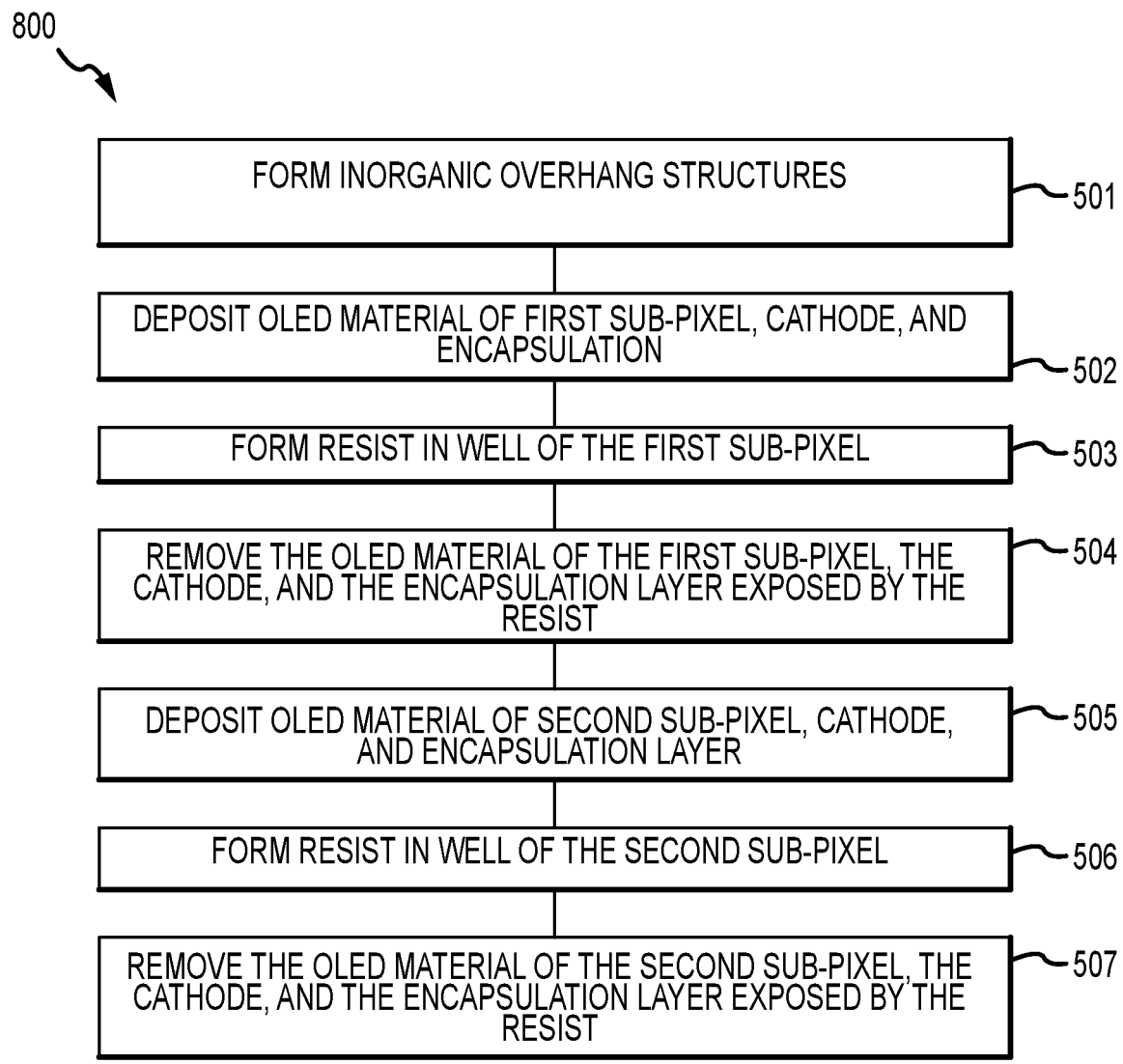
FIG. 5 shows operations of an exemplary method for forming a sub-pixel circuit according to embodiments of the present technology.

FIG. 5 is a flow diagram of a method 500 for forming a sub-pixel circuit 100. The method 500 may correspond to the method to fabricate a sub-pixel circuit 100. FIGS. 6A-6L are schematic, cross-sectional views of a substrate 102 during the method 500 for forming the sub-pixel circuit 100 according embodiments described herein. FIGS. 6A-6C, 6E, 6G, 6I, and 6K may correspond to the plugless arrangement 101A of the first or second exemplary embodiments of the sub-pixel circuit 100. FIGS. 6A, 6B, 6D, 6F, 6H, 6J, and 6L may correspond to the plug arrangement 101B of the third or fourth exemplary embodiments of the sub-pixel circuit 100.

Figure 6A:
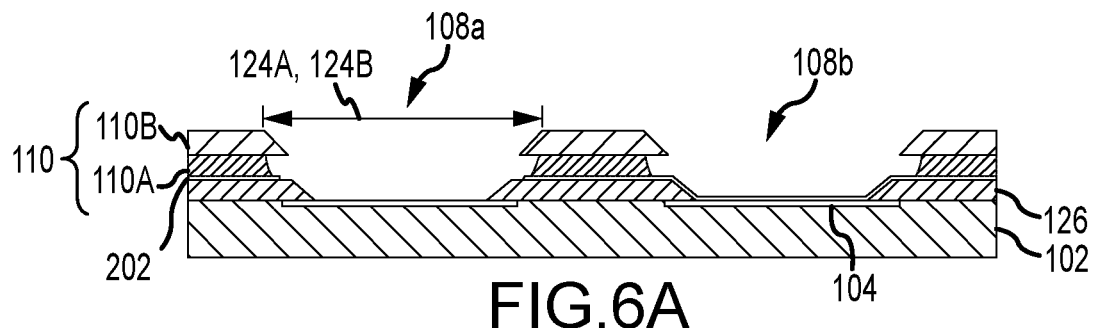
FIGS. 6A-6L show schematic cross-sectional views of a substrate during a method for forming a sub-pixel circuit according embodiments of the present technology.

At operation 501, as shown in FIG. 6A, the overhang structures 110 may be formed. Forming the overhang structures 110 may include depositing a lower portion layer and an upper portion layer over the substrate 102. The lower portion layer may be disposed over the PDL structures 126 and the metal-containing layers 104. The upper portion layer may be disposed over the lower portion layer. The lower portion layer may correspond to the lower portion 110A, and the upper portion layer may correspond to the upper portion 110B of the overhang structures 110. In embodiments including the third and fourth configurations of the overhang structures 110, an assistant cathode layer may be disposed between the lower portion layer 110A and the PDL structures 126. The assistant cathode layer may correspond to the assistant cathode 202. A resist may be disposed and patterned over the upper portion layer. To form the overhang structures 110 portions of the upper portion layer 110B and the lower portion layer 110A exposed by the pixel opening 124A, 124B may be removed.

Figure 6B:
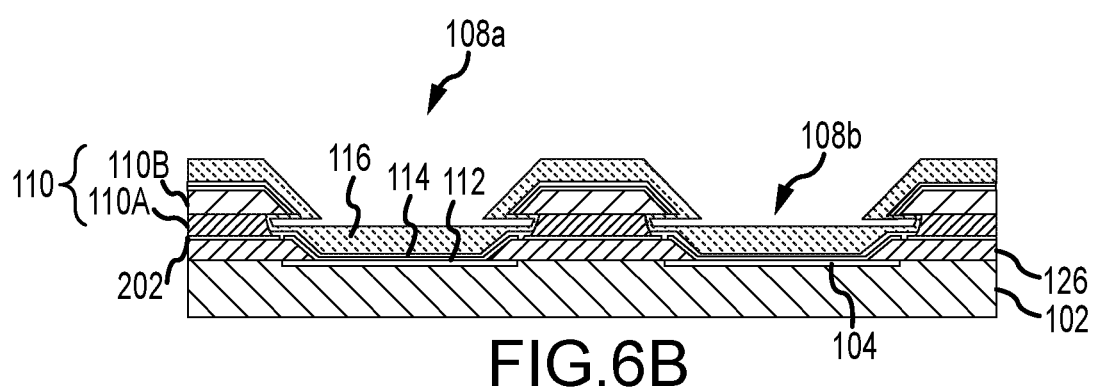

At operation 502, as shown in FIG. 6B, the OLED material 112 of the first sub-pixel 108A, the cathode 114, and the encapsulation layer 116 may be deposited. In embodiments including capping layers, the capping layers may be deposited between the cathode 114 and the encapsulation layer 116. The capping layers may be deposited by evaporation deposition. In the first and second configurations, the OLED material 112 may not contact the lower portion 110A of the overhang structures 110, and the cathode 114 may contact the lower portion 110A of the overhang structures 110. In the third and fourth configurations, the OLED material 112 may not contact the lower portion 110A and the assistant cathode 202, and the cathode 114 may contact at least the assistant cathode 202. The encapsulation layer 116 may be deposited over the cathode 114.

Figure 6C:
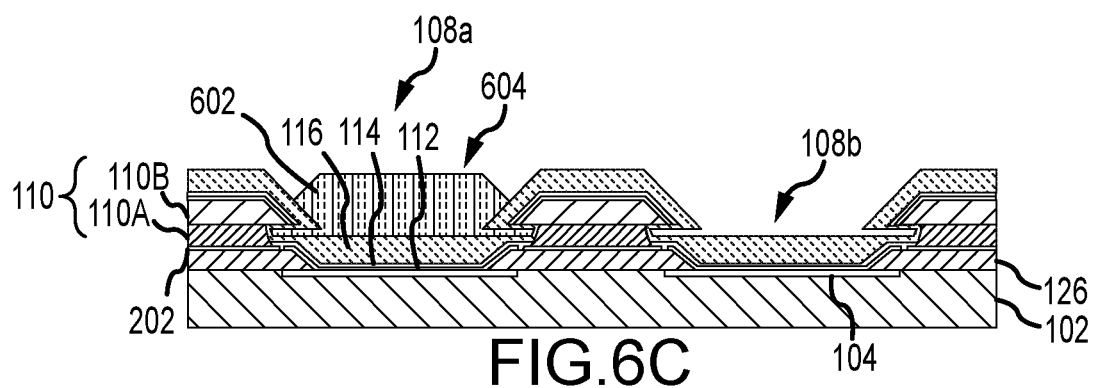
Figure 6D:
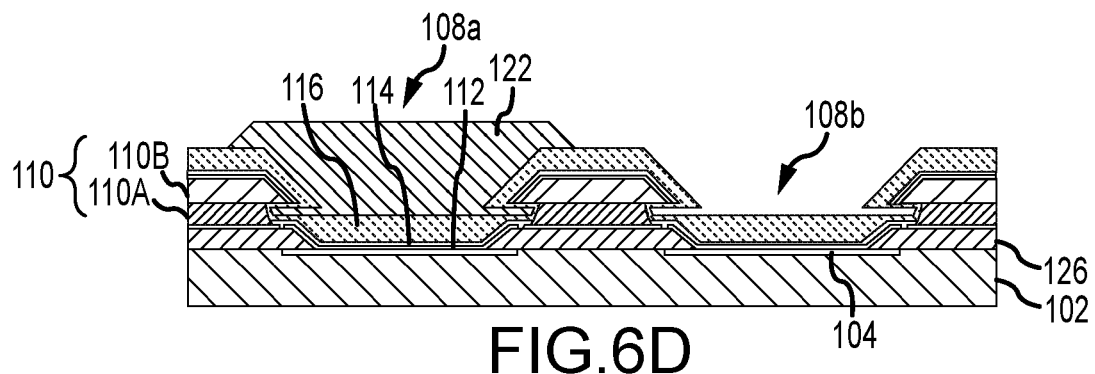
Figure 6E:
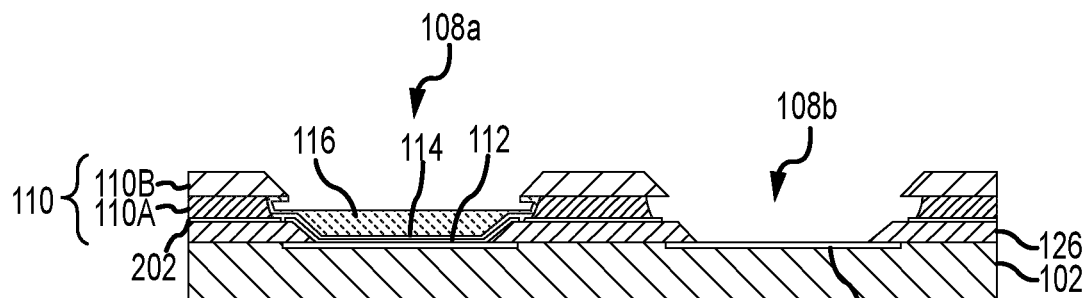
Figure 6F:
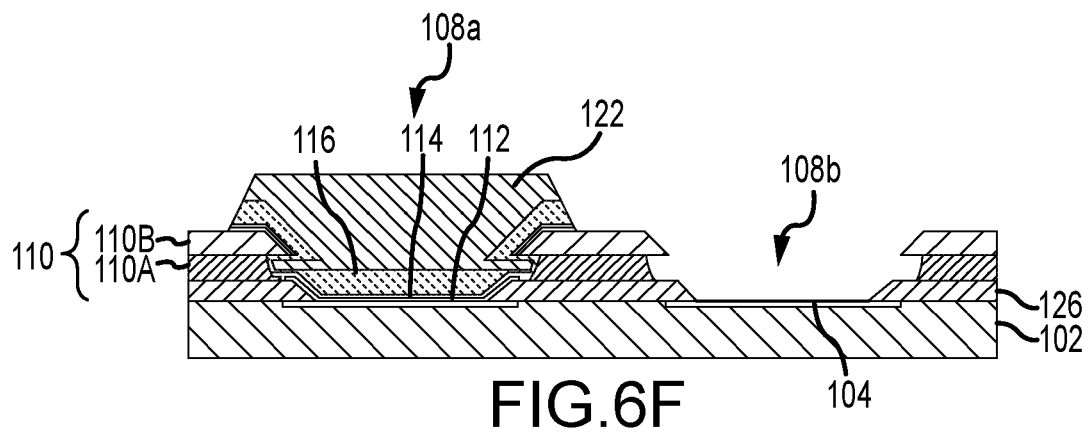

At operation 503, as shown in FIG. 6C, a resist 602 may be formed in a well 604 of the first sub-pixel 108A. At operation 504, as shown in FIGS. 6E-6F, the encapsulation layer 116, the cathode 114, and the OLED material 112 exposed by the resist 602 may be removed. The encapsulation layer 116, the cathode 114, and the OLED material 112 exposed by resist 602 may be removed by dry or wet etch processes. According to embodiments with the plugless arrangement 101A of the sub-pixel circuit 100, the resist 602 may be removed, as shown in FIG. 6E. According to embodiments with the plug arrangement 101B of the sub-pixel circuit 100, the resist 602 may correspond to the plug 122 of the first sub-pixel 108A, as shown in FIGS. 6D and 6F.

Figure 6G:
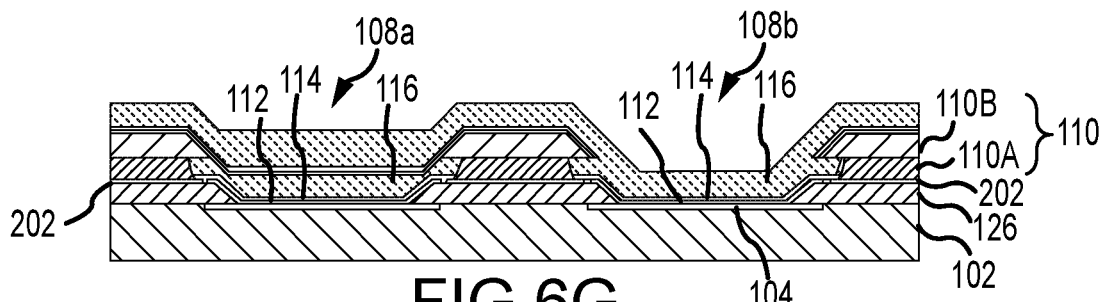
Figure 6H:
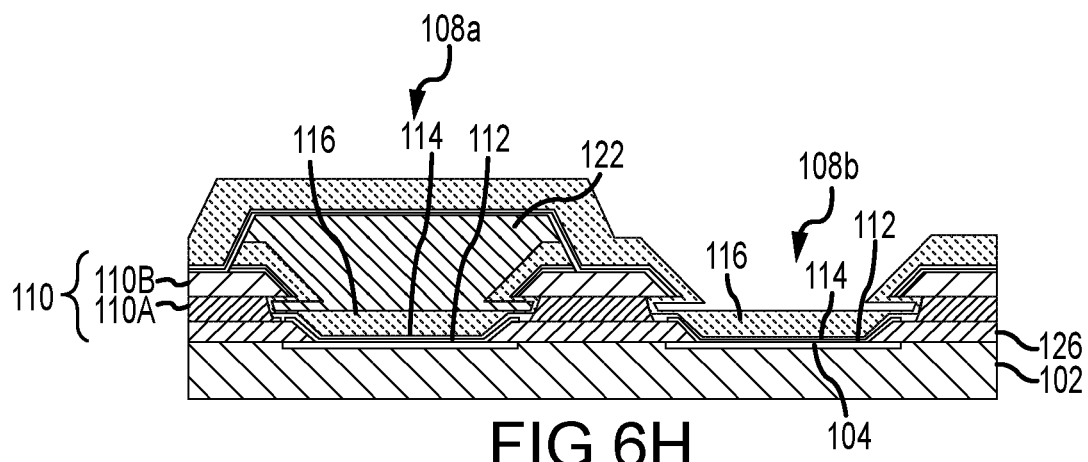

At operation 505, as shown in FIGS. 6G-6H, the OLED material 112 of the second sub-pixel 108b, the cathode 114, and the encapsulation layer 116 may be deposited. In embodiments including capping layers, the capping layers may be deposited between the cathode 114 and the encapsulation layer 116. The capping layers may be deposited by evaporation deposition. The shadowing of the overhang 109 may provide for evaporation deposition each of the OLED material 112 and a cathode 114. In the first and second configurations, the OLED material 112 may not contact the lower portion 110A of the overhang structures 110, and the cathode 114 may contact the lower portion 110A of the overhang structures 110. In the third and fourth configurations, the OLED material 112 may not contact the lower portion 110A and the assistant cathode 202, and the cathode 114 may contact at least the assistant cathode 202. The encapsulation layer 116 may be deposited over the cathode 114.

Figure 6I:
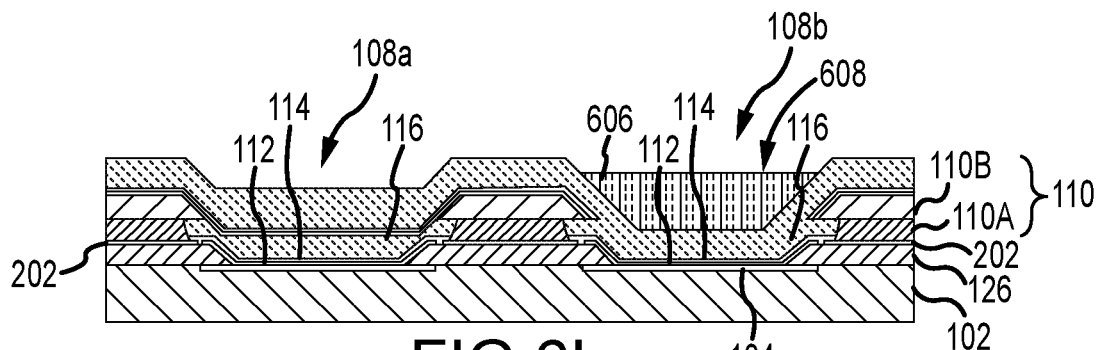
Figure 6J:
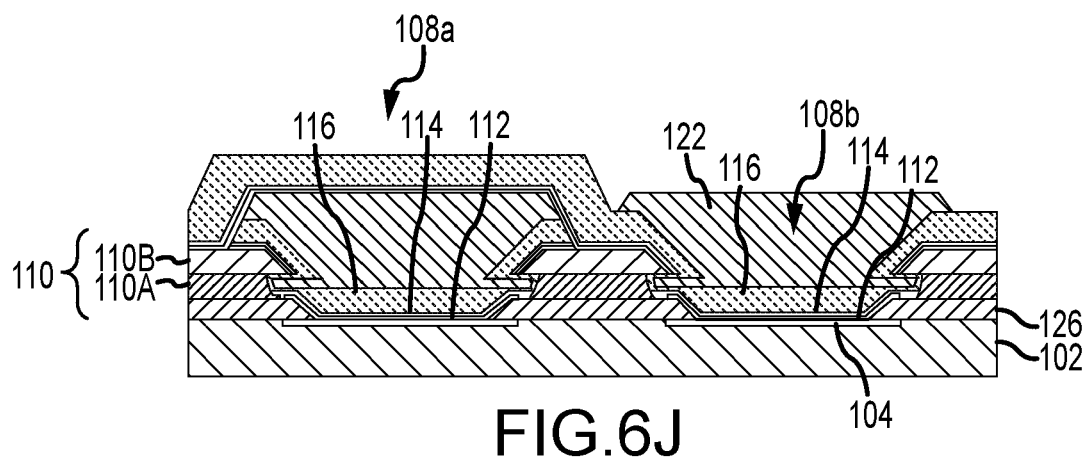
Figure 6K:
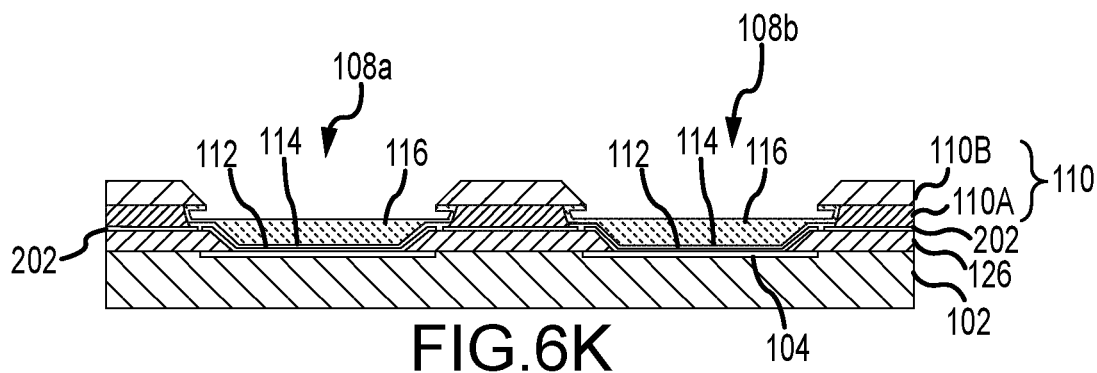
Figure 6L:
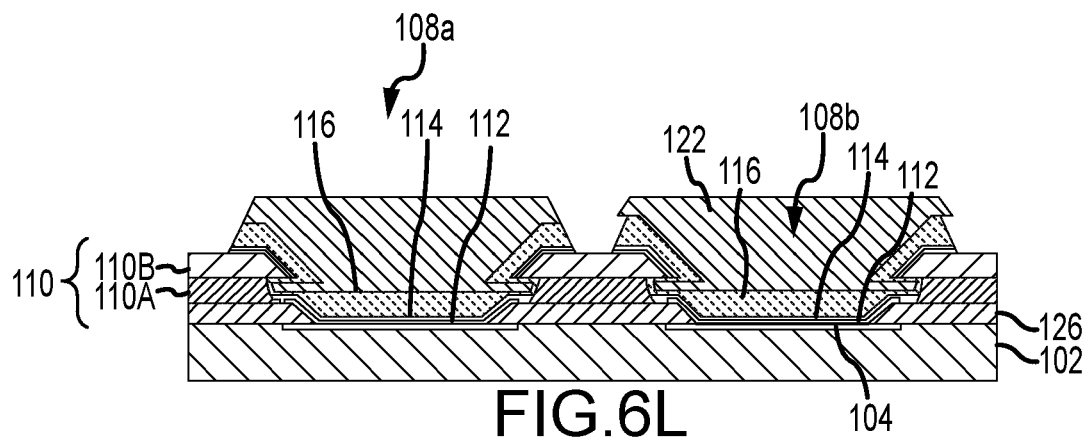

At operation 506, as shown in FIGS. 6I-6J, a resist 606 may be formed in a well 608 of the second sub-pixel 108B. At operation 507, as shown in FIGS. 6K-6L, the encapsulation layer 116, the cathode 114, and the OLED material 112 exposed by the resist 606 may be removed. The encapsulation layer 116, the cathode 114, and the OLED material 112 exposed by resist 606 may be removed by dry or wet etch processes. According to embodiments with the plugless arrangement 101A of the sub-pixel circuit 100, the resist 606 may be removed, as shown in FIG. 6K. According to embodiments with the plug arrangement 101B of the sub-pixel circuit 100, the resist 606 may correspond to the plug 122 of the second sub-pixel 108B, as shown in FIGS. 6J and 6L. Operations 501-507 may form the sub-pixel circuit 100 including two or more sub-pixels 106. Operations 505-507 may be repeated for each addition sub-pixel (e.g., a third and/or a fourth sub-pixel).

Some OLED formation methods have increased the thickness of the metal oxide material overlying the metal layer in attempt to reduce etchants from interacting with the metal layer. However, as the thickness of the metal oxide material is increased, such as to greater than or about 100 nm, efficiency of final devices is sacrificed. The metal oxide material overlying the metal layer may absorb greater amounts of light and contribute to white angular dependency (WAD) issues. Embodiments of the present technology solve this issue by incorporating an amorphous protection material between the metal layer and the second metal oxide material. The amorphous protection material lacks holes that allow etchants to reach the metal layer. Accordingly, the present technology may maintain the second metal oxide material thin enough to absorb minimal amounts of light while simultaneously preventing etchants from interacting with the metal layer.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where neither of the limits, either limit, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the material" includes reference to one or more materials and equivalents thereof known to those skilled in the art, and so forth.

Also, the words "comprise(s)", "comprising", "contain(s) ", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:
1. An OLED device comprising:
a substrate; and
an anode comprising:
    a first metal oxide material overlying the substrate;
    a metal material overlying the first metal oxide material;
    a protective barrier overlying the metal material, wherein the protective barrier comprises an amorphous protection material; and
    a second metal oxide material overlying the protective barrier.
2. The OLED device of claim 1, wherein the protective barrier further comprises a third metal oxide material between the metal material and the amorphous protection material.

3. The OLED device of claim 2, wherein the third metal oxide material is the same metal oxide as the first metal oxide material.

4. The OLED device of claim 2, wherein at least a portion of the third metal oxide material is crystallized.

5. An OLED device processing method comprising:
forming an anode on a substrate, wherein forming the anode comprises:
forming a first metal oxide material on the substrate;
forming a metal layer over the first metal oxide material;
forming an amorphous protection material over the metal layer; and
forming a second metal oxide material over the amorphous protection material, wherein the second metal oxide material comprises a crystalline material having one or more grain boundaries; and
forming an OLED material over the anode.

6. The OLED device processing method of claim 5, wherein the first metal oxide material, the second metal oxide material, or both comprise indium tin oxide (ITO).

7. The OLED device processing method of claim 5, wherein the metal layer comprises silver.

8. The OLED device processing method of claim 5, wherein amorphous protection material comprises indium zinc oxide (IZO), indium tin zinc oxide (ITZO), indium gallium zinc oxide (IGZO).

9. The OLED device processing method of claim 5, wherein a thickness of the amorphous protection material is less than or about 50 nm.

10. The OLED device processing method of claim 5, wherein the amorphous protection material is characterized by a volumetric crystallinity of less than or about 10 vol. %.

11. The OLED device processing method of claim 5, wherein the amorphous protection material is deposited via physical vapor deposition.

12. The OLED device processing method of claim 5, further comprising:
subsequent to forming the second metal oxide material, exposing the substrate to an etchant, wherein the amorphous protection material reduces an amount of etchant interacting with the metal layer.

13. The OLED device processing method of claim 5, further comprising:
subsequent to forming the metal layer, forming a third metal oxide material over the metal layer.

14. The OLED device processing method of claim 13, wherein the third metal oxide material is the same material as the first metal oxide material, the second metal oxide material, or both.

15. The OLED device processing method of claim 13, wherein a combined thickness of the amorphous protection material, the second metal oxide material, the third metal oxide material is less than or about 100 nm.

16. The OLED device processing method of claim 15, wherein the third metal oxide material comprises at least a portion of crystallized material.

17. An OLED device processing method comprising:
forming an anode on a substrate, wherein forming the anode comprises:
forming a first metal oxide material on the substrate;
forming a metal layer over the first metal oxide material;
forming a protective barrier over the metal layer, wherein the protective barrier comprises an amorphous protection material overlying the metal layer; and
forming a second metal oxide material over the amorphous protection material.

18. The OLED device processing method of claim 17, wherein the protective barrier further comprises a third metal oxide material between the metal layer and the amorphous protection material.

19. The OLED device processing method of claim 18, wherein the third metal oxide material is a crystalline material.

20. The OLED device processing method of claim 17, wherein the protective barrier is characterized by a thickness of less than or about 100 nm.

* * * * *